Figure 1:
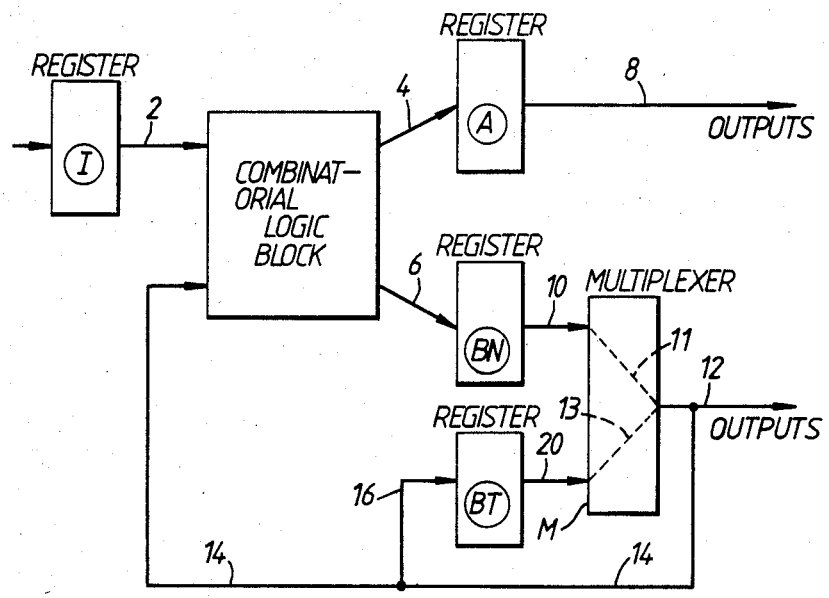

United States Patent [19]
Burrows et al.

[11] Patent Number: 4,724,380
[45] Date of Patent: Feb. 9, 1988

[54] INTEGRATED CIRCUIT HAVING A BUILT-IN SELF TEST DESIGN

[75] Inventors: David F. Burrows, Awbridge nr. Romsey; Mark Paraskeva, Southampton; William L. Knight, Fareham, all of England

[73] Assignee: Plessey Overseas Limited, Ilford, England

[21] Appl. No.: 804,567

[22] Filed: Dec. 4, 1985

[30] Foreign Application Priority Data

Dec. 21, 1984 [GB] United Kingdom ................ 8432458

[51] Int. Cl.⁴ .............................................. G06F 11/00
[52] U.S. Cl. .............................. 324/73 R; 324/158 R; 371/25; 371/24
[58] Field of Search ........................ 324/73 R, 73 AT; 371/25, 24, 15

[56] References Cited

U.S. PATENT DOCUMENTS 3,761,695 9/1973 Eichelberger ........................ 371/25
4,567,593 1/1986 Bashaw ............................ 324/73 AT

OTHER PUBLICATIONS

E. J. Peabody, "System Level Self-Test Method", IBM Technical Disclosure Bulletin; vol. 26, No. 1, Jun. 1983, p. 333.

*Primary Examiner*—Reinhard J. Eizensopf
*Assistant Examiner*—Vinh P. Nguyen
*Attorney, Agent, or Firm*—Michael F. Oglo; Julian C. Renfro

[57] ABSTRACT

An integrated circuit having a built-in self test design, the integrated circuit including a combinatorial logic circuit, a first register coupled to an output of the combinatorial logic circuit and a feedback path via which output signals from the first register are fed back to an input of the combinatorial logic circuit. A multiplexer is provided between the first register and the feedback path, and there is also provided a second register responsive to a signal which is originated to initiate a test function for feeding test signals via the multiplexer and the feedback path to the input of the combinatorial logic circuit.

8 Claims, 2 Drawing Figures

INTEGRATED CIRCUIT HAVING A BUILT-IN SELF TEST DESIGN

The present invention relates to integrated circuits and more particularly to an integrated circuit having a built-in self test design.

Proposals have been made previously for the self-testing of integrated circuits. One of these proposals involves partitioning the integrated circuit into a number of Built-In Logic Block Observation (BILBO) registers and a number of combinatorial logic blocks (CLB). The CLBs are circuits whose output signals are always the same for the same combination of input signals whilst the BILBO registers are registers having a number of different modes of operation, functioning during a self test operation as either a pseudo-random number generator (Pattern Generator Mode) or as a signature analyser (Signature Analyser Mode). In order to test a CLB one of the BILBO registers is operated into its Pattern Generator Mode to feed a pattern of test signals to the CLB. A second BILBO register, driven by the CLB is operated simultaneously into its Signature Analyser Mode to receive the resulting output signals from the CLB which signals are representative of the functional characteristics of the CLB.

In the design of very large integrated circuits it is often necessary to feed some or all of the outputs of a BILBO register back into the CLB it is driven from in order to implement a state machine. In such instances, during the self test phases, the BILBO register cannot usually function simultaneously in its Signature Analyser Mode and send feedback signals to the inputs of the CLB. This may give rise to difficulties when designing a built-in self test integrated circuit having a construction which enables all signal paths to be tested during self test.

An objective of the present invention is to provide an integrated circuit having a construction which facilitates the self-testing of the signal paths.

According to the present invention there is provided an integrated circuit having a built-in self test design, the integrated circuit including a combinatorial logic circuit, a first register means coupled to an output of the combinatorial logic circuit and a feedback path via which output signals from the first register means are fed back to an input of the combinatorial logic circuit, wherein the improvement lies in providing data selecting means coupled between the first register means and the feedback path, and second register means responsive to a signal which is originated to initiate a test function for feeding test signals via the data selecting means and the feedback path to the input of the combinatorial logic circuit.

The second register means is operable in either a Pattern Generator Mode or a Signature Analyser Mode whilst the first register means is simultaneously operable respectively in either a Signature Analyser Mode or a Pattern Generator Mode.

In one embodiment of the present invention there is provided a third register means coupled to an output of the combinatorial logic circuit, the first and third register means being simultaneously operable in a Signature Analyser Mode. A fourth register means may be coupled to an input of the combinatorial logic circuit, the second and fourth register means being simultaneously operable in a Pattern Generator Mode. Advantageously the second and fourth register means are coupled together to behave as a single test pattern generator during a test phase.

In one embodiment of the present invention the register means comprises a plurality of registers, each register means being operable in a number of different modes including the Pattern Generator Mode and the Signature Analyser Mode.

The present invention provides an integrated circuit having a built-in self test design, the integrated circuit comprising a combinatorial logic circuit, a register means coupled to an output of the combinatorial logic circuit and a feedback path via which output signals from the register means are fed back to an input of the combinatorial logic circuit wherein the improvement lies in the provision of further registers operable for initiating a test function for feeding through the data selecting means signals which are recognized by the combinatorial logic circuit and analysed by the register means thereby to provide output signals indicative of the functional character of the integrated circuit.

The integrated circuits or parts thereof having feedback designs in accordance with the present invention find particular application in providing a self test facility for very large integrated circuits. In preferred embodiments of the present invention the integrated circuit comprises a plurality of combinatorial logic circuits and a plurality of registers arranged relative to one another for enabling explicit checking of all of the combinatorial logic circuits, registers and all of the signal paths in the integrated circuit during a self test operation.

Figure 2:
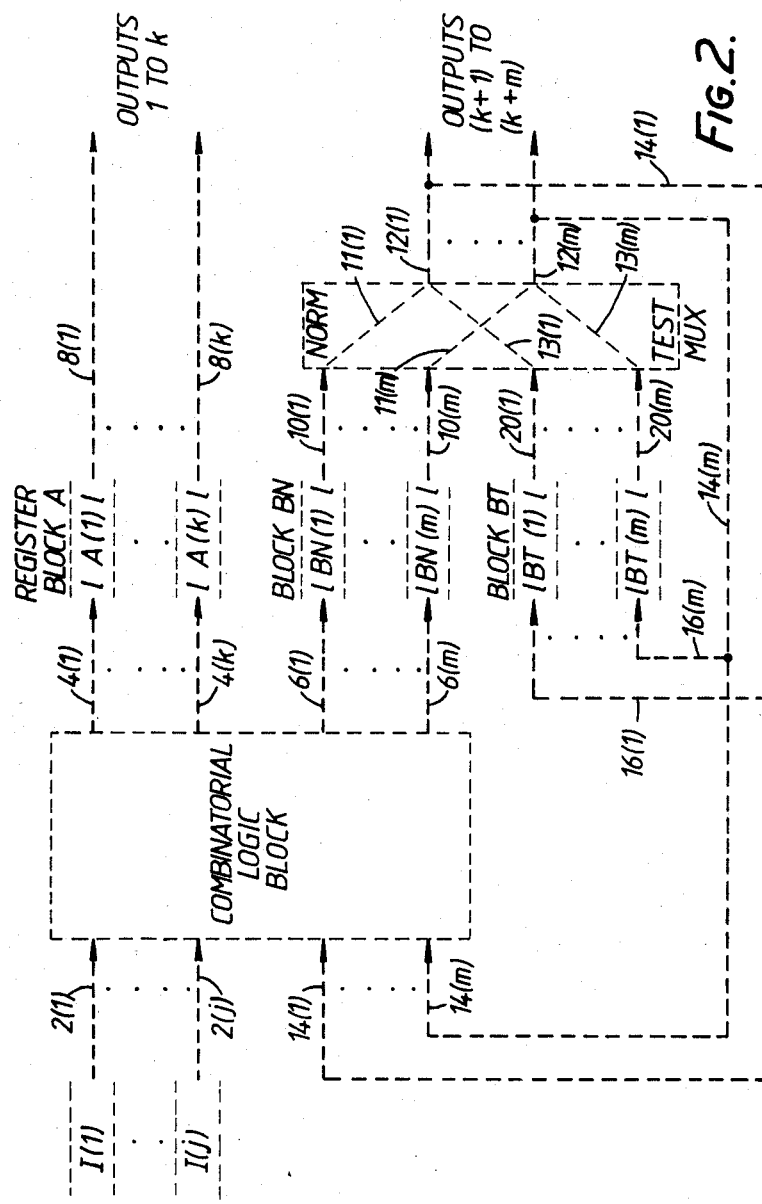

The present invention will be described by way of example with reference to the accompanying drawings in which:

FIG. 1 is a block diagram of part of an integrated circuit in accordance with one embodiment of the present invention and FIG. 2 is a more detailed diagram of the signal paths used in FIG. 1.

The circuit arrangement of FIG. 1 comprises a combinatorial logic circuit CLB and four register blocks RB. Each register block comprises a number of registers which are of conventional BILBO register construction, or a modification thereof, but all providing a capability to operate when suitably controlled in a number of different modes including a Pattern Generator Mode and a Signature Analyser Mode. As can be seen more clearly from FIG. 2 a register block "I" consists of J registers I(1) to I(J), a register block "A" consists of k registers A(1) to A(k), a register block "BN" consists of m registers BN(1) to BN(m) and a register block "BT" consists of m registers BT(1) to BT(m).

Referring to FIG. 1 the register block "I", feeds input signals to the CLB along a line 2, the output signals of the CLB being fed along lines 4 and 6 to the register blocks "A" and "BN" respectively. The outputs from the register block "A" are fed via a line 8 to an output terminal block (not shown) or other circuit element, the outputs from the register block "BN" also being fed to the output terminal block or other circuit element but via a line 10, a connectable line 11 through a data selecting device in the form of a multiplexer M and a line 12. A feedback line 14 is connected between the line 12 and further inputs of the CLB.

The register block "BT" has its inputs connected to the feedback line 14 via a line 16, the outputs of the register block "BT" being fed via a line 20 and a connectable line 13 through the multiplexer M to the line 12.

As can be seen in FIG. 2 the line 2 consists of J signal paths 2(1) to 2(J); the line 4 consists of k signal paths 4(1) to 4(k); the line 6 consists of m signal paths 6(1) to 6(m); the line 8 consists of k signal paths 8(1) to 8(k); the line 10 consists of m signal paths 10(1) to 10(m); the line 11 consists of m signal paths 11(1) to 11(m); the line 12 consists of m signal paths 12(1) to 12(m); the line 13 consists of m signal paths 13(1) to 13(m); the feedback line 14 consists of m signal paths 14(1) to 14(m); the line 16 consists of m signal paths 16(1) to 16(m) and the line 20 consists of m signal paths 20(1) to 20(m).

In operation, with the register blocks operating as normal registers, the register block "A" drives the outputs 1 to k that are not involved in local feedback to the CLB, the multiplexer M selects the signal paths 11(1) to 11(m) so that the register block "BN" drives the feedback signal paths 14(1) to 14(m), and the register block "BT" is not used. During this normal operation the circuitry in use consists of the CLB, the register blocks "I", "A", "BN" and the signal paths associated with the lines 2,4,6,8,10,11,12 and 14.

During a first phase of the self test the multiplexer M selects the signal paths 13(1) to 13(m) so that the register block "BT" is able to drive the feedback signal paths 14(1) to 14(m). Both the register blocks "I" and "BT" are operated in their Test Pattern Generator Mode and should be coupled together to behave as a single test pattern generator during the first test phase. During the first test phase "A" and "BN" are both operated in their Signature Analyser Mode to analyse the output responses from the CLB fed along the lines 4 and 6. The circuitry under test during the first test phase consists of the CLB and the signal paths associated with lines 2,4,6,13,14,20 and the portion of line 12 extending between the multiplexer M and connection to the line 14.

During a second phase of the self test the multiplexer M selects the signal paths 11(1) to 11(m) so that the register block "BN" is able to drive the feedback signal paths 14(1) to 14(m). The register block "BN" is operated into its Test Pattern Generator Mode and the register block "BT" is operated into its Signature Analyser Mode to analyse input signals fed along the signal paths 16(1) to 16(m). The circuitry under test during the second test phase consists of the signal paths associated with the lines 10,11,16, the portion of line 14 extending between the connections to the line 12 and the line 16 and the portion of the line 12 extending between the multiplexer M and the connection to the line 14.

By carrying out the two test phases above there is provided a test involving an explicit check on the functional characteristics of all of the signal paths associated with the lines 2,4,6,10,11,13,14,16 and 20 as well as providing a check on the functional characteristics of the CLB.

Integrated circuits or parts thereof having feedback designs in accordance with the present invention are particularly useful in providing a self test facility for very large integrated circuits which can be designed by partitioning into combinatorial logic blocks and register blocks. The present invention provides a means for designing integrated circuits having a self test facility enabling explicit checking of all of the functional elements and all of the signal paths in the integrated circuit.

It will be appreciated that in preferred embodiments of the present invention the whole of the integrated circuit can be self tested by suitable partitioning of the integrated circuit. It is to be understood however that the scope of the present invention also includes embodiments in which a substantial part, as opposed to the whole, of the integrated circuit can be self tested. Such methods of testing and circuitry design are described in our co-pending U.K. Patent Application No. 8432533 corresponding to our co-pending U.S. patent application Ser. No. 807,913.

It will be understood to the man skilled in the art that any logic block which can be preloaded, either before or during the testing operation, so as to establish a direct mapping of at least some of its input to its output can then also be treated as a combinatorial logic block for the purposes of the present invention.

What is claimed is:

1. An integrated circuit having a built-in self test design, the integrated circuit including a combinatorial logic circuit, a first register means the input of which is coupled to an output of the combinatorial logic circuit and a feedback path via which output signals from the first register means are fed back to an input of the combinatorial logic circuit, the first register means being selectively operable between a Pattern Generator Mode and a Signature Analyser Mode, wherein the improvement comprises the provision of a data selecting means in the feedback path between the output of the first register means and the input of the combinatorial logic circuit, and the provision of a second register means the output of which is coupled to the input of the data selecting means and the input of which is coupled to the output of the data selecting means, the second register means being selectively operable between a Pattern Generator Mode and a Signature Analyser Mode whereby when the second register means is operating in a Pattern Generator Mode for feeding test signals via the data selecting means to the combinatorial logic circuit the output signal from the combinatorial logic circuit are fed to the first register means operating in its Signature Analyser Mode and whereby when the first register means is operating in a Pattern Generator Mode for feeding test signals via the data selecting means to the second register means, the second register means operates in its signature analyser mode.

2. An integrated circuit as claimed in claim 1 wherein there is provided a third register means the input of which is coupled to an output of the combinatorial logic circuit the first and third register means being simultaneously operable in a Signature Analyser Mode.

3. An integrated circuit as claimed in claim 2 wherein there is provided a fourth register means the output of which is coupled to an input of the combinatorial logic circuit, the second and the fourth register means being simultaneously operable in a Pattern Generator Mode.

4. An integrated circuit as claimed in claim 3 wherein the second and fourth register means are coupled together to behave as a single test pattern generator during a test phase.

5. An integrated circuit as claimed in claim 4 wherein one or more of the register means comprises a plurality of registers, each register means being operable in a number of different modes including the Pattern Generator Mode and the Signature Analyser Mode.

6. An integrated circuit having a built-in self test design, the integrated circuit comprising a combinatorial logic circuit, a register means the input of which is coupled to an ouput of the combinatorial logic circuit and a feedback path via which output signals from the register means are fed back to an input of the combinatorial logic circuit, the register means being selectively operable between a Pattern Generator Mode and a Signature Analyser mode, wherein the improvement comprises the provision of a further register and a data selecting means in the feedback path between the ouput of the register means and the input of the combinatorial logic circuit, said further register being operable for initiating a test function for feeding through the data selecting means signals which are recognized by the combinatorial logic circuit and analysed by the register means thereby to provide output signals indicative of the functional character of the integrated circuit.

7. An integrated circuit as claimed in claim 1 wherein the integrated circuit comprises a plurality of combinatorial logic circuits and a plurality of registers arranged relative to one another for enabling explicit checking of all of the combinatorial logic circuits, registers and all of the signal paths in the integrated circuit during a self test operation.

8. An integrated circuit as claimed in claim 6 wherein the integrated circuit comprises a plurality of combinatorial logic circuits and a plurality of registers arranged relative to one another for enabling explicit checking of all of the combinatorial logic circuits, registers and all of the signal paths in the integrated circuit during a self-test operation.

* * * * *